(12) United States Patent
Klein et al.

(10) Patent No.: US 10,981,780 B2
(45) Date of Patent: Apr. 20, 2021

(54) MEMBRANE SUPPORT FOR DUAL BACKPLATE TRANSDUCERS

(71) Applicant: Infineon Technologies AG, Neubiberg (DE)

(72) Inventors: Wolfgang Klein, Zorneding (DE); Evangelos Angelopoulos, Munich (DE); Stefan Barzen, Munich (DE); Marc Fueldner, Neubiberg (DE); Stefan Geissler, Regensburg (DE); Matthias Friedrich Herrmann, Munich (DE); Ulrich Krumbein, Rosenheim (DE); Konstantin Tkachuk, Unterhaching (DE); Giordano Tosolini, Munich (DE); Juergen Wagner, Nittendorf (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/543,970

(22) Filed: Aug. 19, 2019

(65) Prior Publication Data

US 2021/0053821 A1 Feb. 25, 2021

(51) Int. Cl.
| | | |
|---|---|---|
| *B81C 1/00* | (2006.01) | |
| *B81B 3/00* | (2006.01) | |
| *B81B 7/02* | (2006.01) | |
| *H04R 31/00* | (2006.01) | |
| *H04R 7/02* | (2006.01) | |

(Continued)

(52) U.S. Cl.
CPC ........ *B81C 1/00158* (2013.01); *B81B 3/0021* (2013.01); *B81B 7/02* (2013.01); *B81C 1/00103* (2013.01); *H04R 1/08* (2013.01); *H04R 7/02* (2013.01); *H04R 7/08* (2013.01); *H04R 31/003* (2013.01); *B81B 2201/0257* (2013.01); *B81B 2203/0127* (2013.01); *B81B 2203/0384* (2013.01); *B81C 2201/013* (2013.01); *H04R 2201/003* (2013.01)

(58) Field of Classification Search
CPC ...... H04R 1/08; H04R 7/08; H04R 2201/003; H04R 7/02; H04R 19/005; H04R 19/016; H04R 19/04; B81B 3/0021; B81B 7/02; B81B 2203/0127; B81B 2201/0257; B81B 2203/0382; B81C 1/00158; B81C 1/00103; B81C 2201/013
See application file for complete search history.

(56) References Cited

U.S. PATENT DOCUMENTS

| | | | | |
|---|---|---|---|---|
| 3,663,768 | A | * | 5/1972 | Madsen .......... H04R 19/01 381/191 |
| 8,461,655 | B2 | | 6/2013 | Klein et al. |

(Continued)

FOREIGN PATENT DOCUMENTS

EP 2505548 A2 10/2012

*Primary Examiner* — Galina G Yushina
(74) *Attorney, Agent, or Firm* — Slater Matsil, LLP

(57) ABSTRACT

A microfabricated structure includes a deflectable membrane, a first clamping layer on a first surface of the deflectable membrane, a second clamping layer on a second surface of the deflectable membrane, a first perforated backplate on the first clamping layer, and a second perforated backplate on the second clamping layer, wherein the first clamping layer comprises a first tapered edge portion having a negative slope between the first perforated backplate and the deflectable membrane.

21 Claims, 15 Drawing Sheets

(51) Int. Cl.
   *H04R 1/08*      (2006.01)
   *H04R 7/08*      (2006.01)

(56) References Cited

U.S. PATENT DOCUMENTS

| | | |
|---|---|---|
| 9,181,080 B2 | 11/2015 | Dehe et al. |
| 9,309,105 B2 | 4/2016 | Dehe et al. |
| 9,540,226 B2 | 1/2017 | Klein et al. |
| 9,628,886 B2 | 4/2017 | Dehe et al. |
| 9,736,590 B2 | 8/2017 | Klein et al. |
| 9,986,344 B2 | 5/2018 | Dehe et al. |
| 2008/0036039 A1* | 2/2008 | Aspar ................ B81C 1/00595 257/618 |
| 2012/0248554 A1* | 10/2012 | Klein .................... B81B 3/0072 257/416 |
| 2013/0089224 A1* | 4/2013 | Dehe ....................... H04R 7/04 381/191 |
| 2015/0001647 A1 | 1/2015 | Dehe et al. |
| 2015/0251285 A1 | 9/2015 | Dehe et al. |
| 2017/0311082 A1 | 10/2017 | Klein et al. |

\* cited by examiner

| Si Substrate |
|---|
| IsolationLayer1(TEOS) |
| Backplate 1 |
| - |
| - |
| IsolationLayer2(TEOS) |
| Membrane |
| IsolationLayer3(TEOS) |
| - |
| - |
| Backplate 2 |
| Metal Contact |
| Cavity Etch |
| Isolation Release Etch |

Fig. 6A

| Si Substrate |
|---|
| IsolationLayer1(TEOS) |
| Backplate 1 |
| - |
| - |
| IsolationLayer2(TEOS) |
| Membrane |
| IsolationLayer3a(TEOS) |
| IsolationLayer3b(PSG) |
| - |
| Backplate 2 |
| Metal Contact |
| Cavity Etch |
| Isolation Release Etch |

Fig. 6B

| Si Substrate |
|---|
| IsolationLayer1(TEOS) |
| Backplate 1 |
| - |
| IsolationLayer2a(PSG) |
| IsolationLayer2b(TEOS) |
| Membrane |
| IsolationLayer3(TEOS) |
| - |
| - |
| Backplate 2 |
| Metal Contact |
| Cavity Etch |
| Isolation Release Etch |

Fig. 6C

| Si Substrate |
|---|
| IsolationLayer1(TEOS) |
| Backplate 1 |
| - |
| IsolationLayer2a(PSG) |
| IsolationLayer2b(TEOS) |
| Membrane |
| IsolationLayer3a(TEOS) |
| IsolationLayer3b(PSG) |
| - |
| Backplate 2 |
| Metal Contact |
| Cavity Etch |
| Isolation Release Etch |

Fig. 6D

| Si Substrate | 602 |
|---|---|
| IsolationLayer1 | 604 |
| Backplate 1 | 606 |
| IsolationLayer2a | 608 |
| IsolationLayer2b | 610 |
| IsolationLayer2c | 612 |
| Membrane | 614 |
| IsolationLayer3a | 616 |
| IsolationLayer3b | 618 |
| IsolationLayer3c | 620 |
| Backplate 2 | 622 |
| Metal Contact | 624 |
| Cavity Etch | 626 |
| Release Etch | 628 |

MEMBRANE SUPPORT FOR DUAL BACKPLATE TRANSDUCERS

TECHNICAL FIELD

The present invention relates generally to a system and method for supporting a membrane in a dual backplate transducer.

BACKGROUND

Transducers convert signals from one domain to another and are often used in sensors. One common sensor with a transducer that is seen in everyday life is a microphone that converts sound waves to electrical signals.

Microelectromechanical system (MEMS) based sensors include a family of transducers produced using micromachining techniques. MEMS, such as a MEMS microphone, gather information from the environment by measuring the change of physical state in the transducer and transferring the signal to be processed by the electronics which are connected to the MEMS sensor. MEMS devices may be manufactured using micromachining fabrication techniques similar to those used for integrated circuits.

MEMS devices may be designed to function as oscillators, resonators, accelerometers, gyroscopes, pressure sensors, microphones, micro-mirrors, etc. Many MEMS devices use capacitive sensing techniques for transducing the physical phenomenon into electrical signals. In such applications, the capacitance change in the sensor is converted to a voltage signal using interface circuits.

For example, a capacitive MEMS microphone includes a backplate electrode and a membrane arranged in parallel with the backplate electrode. The backplate electrode and the membrane form a parallel plate capacitor. The backplate electrode and the membrane are supported by a support structure arranged on a substrate.

The capacitive MEMS microphone is able to transduce sound pressure waves, for example speech, at the membrane arranged in parallel with the backplate electrode. The backplate electrode is perforated such that sound pressure waves pass through the backplate while causing the membrane to vibrate due to a pressure difference formed across the membrane. Hence, the air gap between the membrane and the backplate electrode varies with vibrations of the membrane. The variation of the membrane in relation to the backplate electrode causes variation in the capacitance between the membrane and the backplate electrode. This variation in the capacitance is transformed into an output signal responsive to the movement of the membrane and forms a transduced signal.

One characteristic of a MEMS device is the robustness of the MEMS device. For example, a capacitive MEMS microphone has a characteristic robustness which determines the magnitude of shock or impact the MEMS microphone can withstand without damage. Often, the membrane, which is deflectable, is more prone to fracture or failure from shock or impact than other portions of the MEMS microphone.

SUMMARY

According to an embodiment, a microfabricated structure comprises a deflectable membrane; a first clamping layer disposed on a first surface of the deflectable membrane; a second clamping layer disposed on a second surface of the deflectable membrane; a first perforated backplate disposed on the first clamping layer; and a second perforated backplate disposed on the second clamping layer, wherein the first clamping layer comprises a first tapered edge portion having a negative slope between the first perforated backplate and the deflectable membrane.

According to an embodiment, a microfabricated structure comprises a perforated stator; a first isolation layer disposed on a first surface of the perforated stator; a second isolation layer disposed on a second surface of the perforated stator; a first membrane disposed on the first isolation layer; a second membrane disposed on the second isolation layer; and a pillar coupled between the first membrane and the second membrane, wherein the first isolation layer comprises a first tapered edge portion having a negative slope between the perforated stator and the first membrane.

According to an embodiment, a method comprises forming a membrane; forming a first clamping layer on a first surface of the membrane; forming a second clamping layer on a second surface of the membrane; forming a first backplate on the first clamping layer; forming a second backplate disposed on the second clamping layer; and etching the first clamping layer to form a first tapered edge portion having a negative slope between the first backplate and the membrane.

BRIEF DESCRIPTION OF THE DRAWINGS

For a more complete understanding of the present invention, and the advantages thereof, reference is now made to the following descriptions taken in conjunction with the accompanying drawings, in which:

FIGS. 6A, 6B, 6C, 6D, and 6E are layer tables associated with the MEMS microphones of FIGS. 3A, 3B, 4B, 5B, and 5C;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely microphone transducers, and more particularly, MEMS microphones. Some of the various embodiments described herein include double backplate silicon microphones and sealed dual membrane silicon microphones.

A double backplate MEMS silicon microphone typically includes top and bottom perforated backplates, a flexible membrane, a top clamping layer between the top backplate and the flexible membrane, and a bottom clamping layer between the bottom backplate and the flexible membrane. A high robustness against air pressure and drop test for one direction can be reached by offsetting the relative positions of the oxide edges of the top and bottom clamping layers. For the other direction, the dual backplate microphone shows a significant weakness in robustness. Thus, according to embodiments high robustness is achieved in both directions by using at least one tapered clamping layer in addition to the relative placement of the oxide edges of the top and bottom clamping layers. Other embodiments achieve even higher robustness in both directions by using two tapered clamping layers, or by using two double-tapered clamping layers.

A sealed dual membrane MEMS silicon microphone typically includes top and bottom membranes, a perforated stator, a top isolation layer between the top membrane and the stator, a bottom isolation layer between the bottom membrane and the stator, and a pillar coupled between the top membrane and the bottom membrane. A high robustness against air pressure and drop test is difficult to reach. With regard to both directions, the sealed dual membrane microphone shows a significant weakness in robustness. Thus, according to embodiments, high robustness is achieved in both directions by using two tapered or double-tapered isolation layers for top and bottom clamping layers.

Figure 1A:
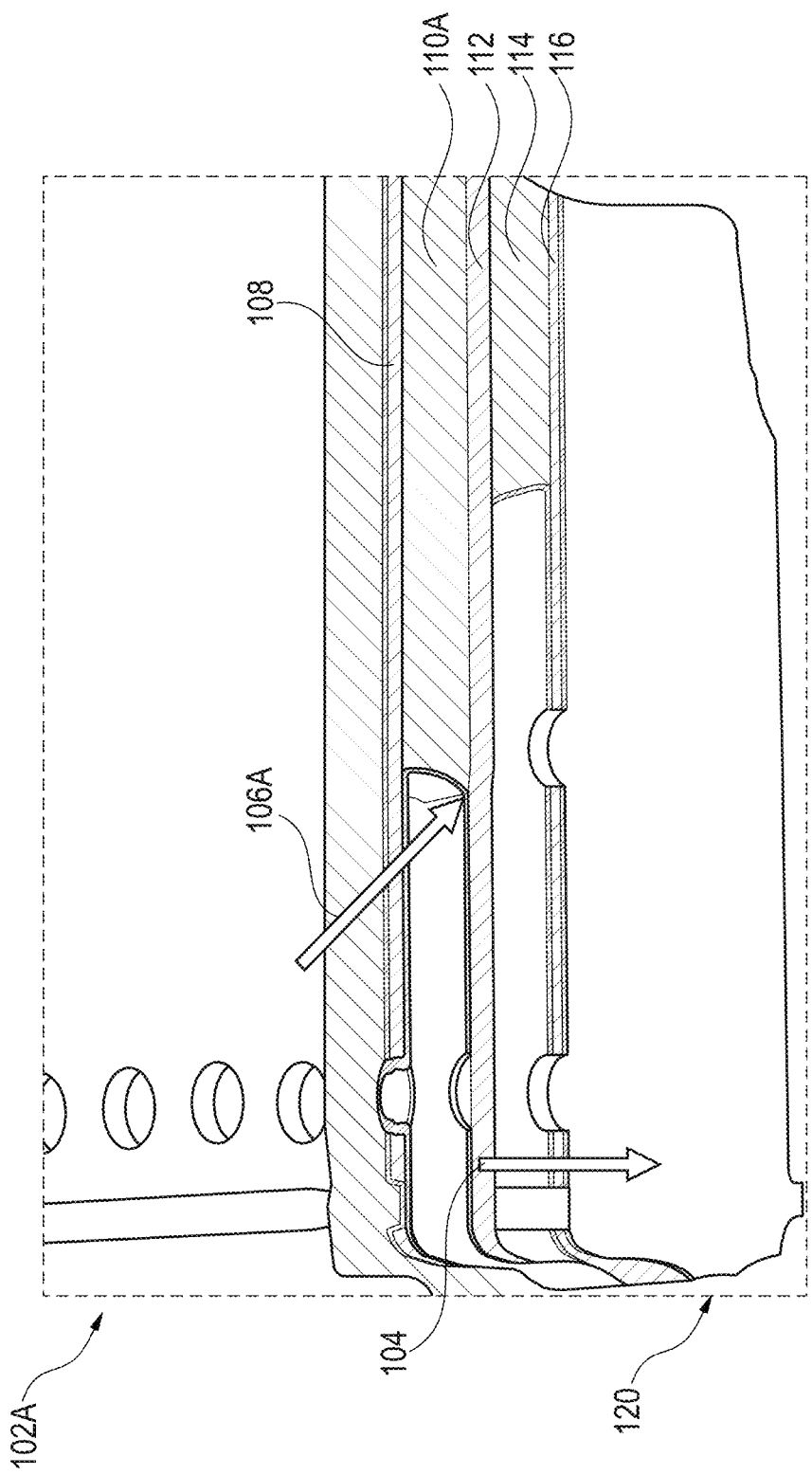
FIGS. 1A, 3A, 4A, and 5A are cross-sectional diagrams of exemplary dual backplate MEMS microphones.

FIG. 1A is a cross-sectional view of an exemplary dual backplate silicon microphone 102A including a top perforated silicon backplate 108, a top oxide clamping layer 110A, a flexible silicon membrane 112, a bottom oxide clamping layer 114, and a bottom perforated silicon backplate 116. The vertical edge of the top clamping layer 110A is offset with respect to the vertical edge of the bottom clamping layer 114 to increase robustness if membrane 112 is deflected to the top. However, for the other direction (membrane 112 deflected to the bottom), the dual backplate microphone 102A shows a significant weakness in robustness. Due to the nearly vertical shaped membrane clamping on both sides of membrane 112, a "hot spot" or "notch effect" 106A is created if membrane 112 is deflected to the bottom (downward direction arrow 104).

Figure 1B:
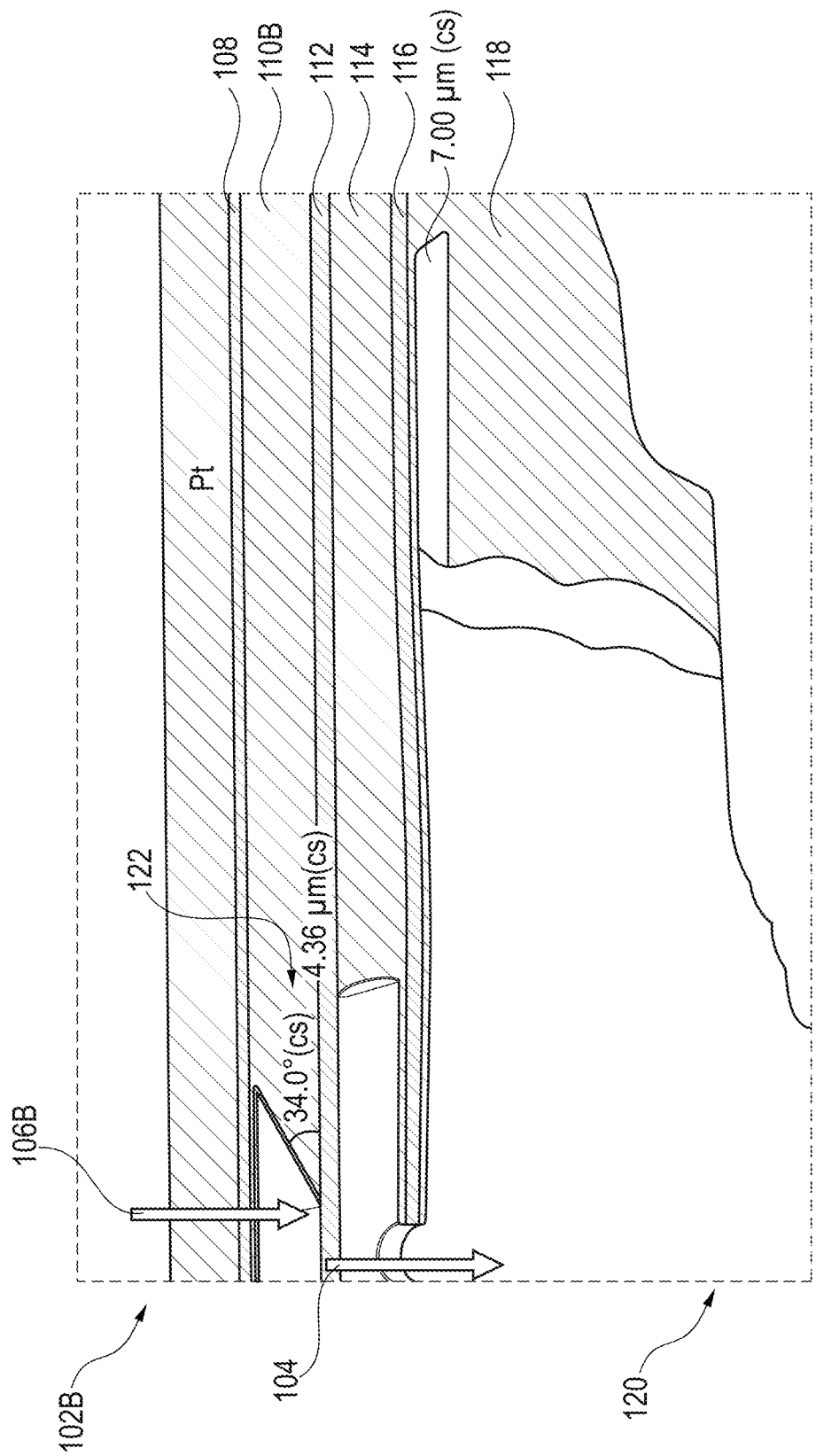
FIGS. 1B, 2A, 3B, 4B, 5B, and 5C are cross-sectional diagrams of a dual backplate MEMS microphone according to embodiments.

FIG. 1B is a cross-sectional view of a dual backplate silicon microphone 102B with increased robustness in both directions according to an embodiment including a top perforated silicon backplate 108, a tapered top oxide clamping layer 110B, a flexible silicon membrane 112, a bottom oxide clamping layer 114, and a bottom perforated silicon backplate 116. While the tapered edge of the top clamping layer 110B is offset with respect to the vertical edge of the bottom clamping layer 114 to increase robustness if membrane 112 is deflected to the top, the tapered edge of the top clamping layer 110B itself increases robustness if membrane 112 is deflected to the bottom as is explained in further detail below.

The slope of the tapered top clamping layer 110B is "negative" (downhill) from the top backplate 108 to the membrane 112. Contrariwise, the slope of the tapered top clamping layer 110B is "positive" (uphill) from the membrane 112 to the top backplate 108. A typical taper angle 122 of 34° with respect to membrane 112 is shown in FIG. 1B, although a range of taper angles can be used to advantageously provide the increased robustness and reduce the "hot spot" or "notch effect" 106B if membrane 112 is deflected to the bottom (downward direction arrow 104).

A silicon substrate 18 is also shown in FIG. 1B, which provides the support for dual backplate microphone 102B. A cavity 120 in the substrate 18 is also shown below the perforations in dual backplate microphone 102B.

Figure 2A:
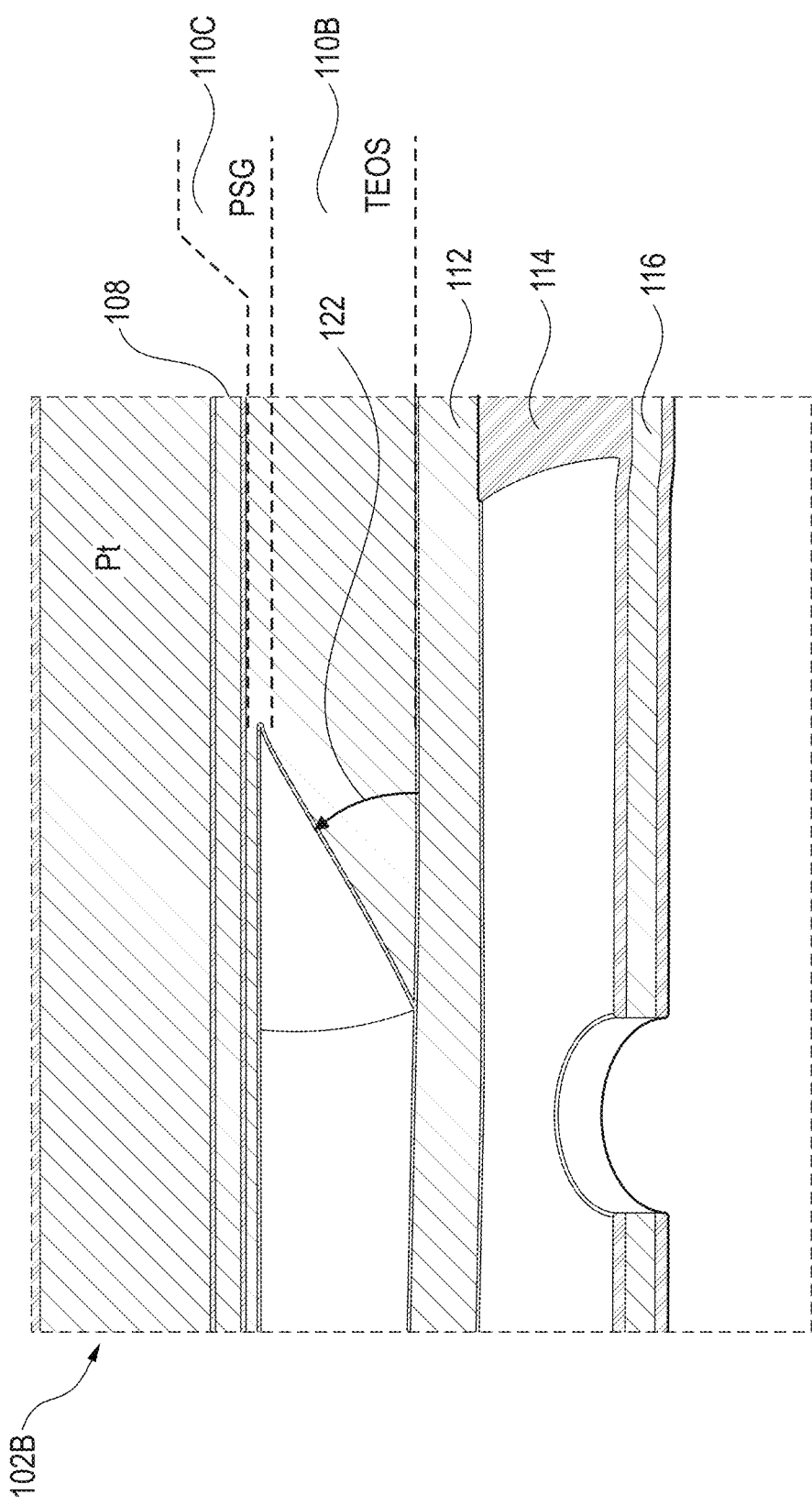

FIG. 2A is a cross-sectional diagram of dual backplate microphone 102B showing further details of the top clamping layer 110B. In particular, FIG. 2A shows an additional upper clamping layer 110C. In an example, clamping layers 110B and 110C form a TEOS/PSG oxide layer stack for clamping the top side of membrane 112. TEOS is known in the art as Tetra Ethyl Ortho Silicate, and PSG is known in the art as a TEOS-based Phosphorus Silicate Glass. The TEOS and PSG layers may also be referred to as glass layers. The etch rate of TEOS is approximately 20 nm/min (low etch rate), whereas the etch rate of PSG (5.1% phosphorous) is approximately 35 nm/min (high etch rate). The combination of a thin PSG clamping layer 110C and a relatively thicker TEOS clamping layer 110B results in the combination clamping layer having a tapered edge with an acute taper angle 122 as shown. An isotropic etch of vertical edges of clamping layers 110C and 110B in an initial manufacturing phase (not shown in FIG. 2A) will, as the etch progresses in time, eventually result in the linearly tapered edge shown in FIG. 2A due to the relative etch rates of layers 110C and 110B.

Figure 2B:
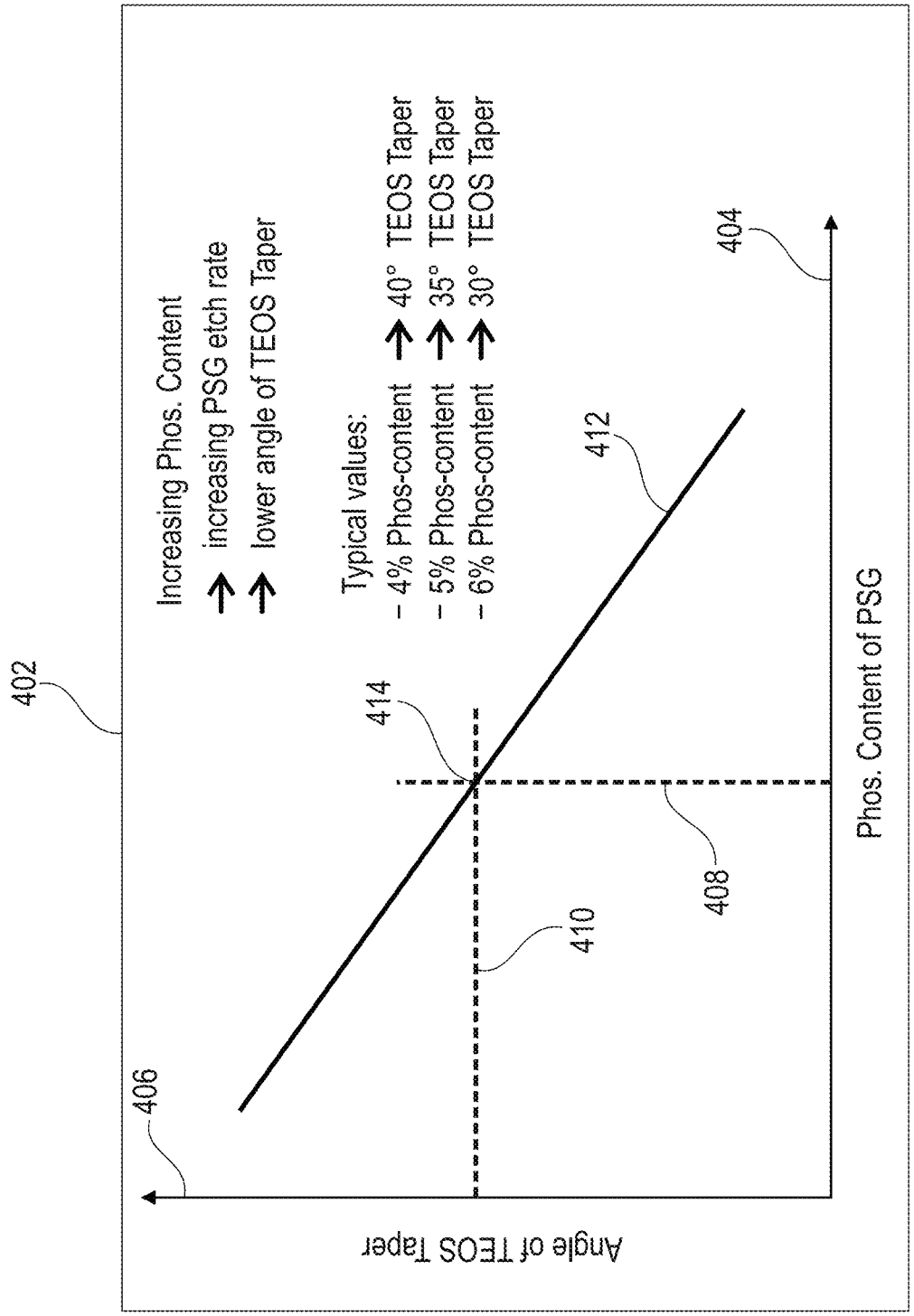
FIG. 2B is a graph of phosphorous content versus clamping layer taper angle according to an embodiment.

FIG. 2B is a graph 402 of the taper angle 406 of the TEOS clamping layer versus the phosphorous content 404 of the PSG clamping layer according to an embodiment. Increasing the phosphorous content of the clamping layer 110C shown in FIG. 2A increases the PSG etch rate, and thus decreases the taper angle of clamping layer 110B shown in FIG. 2A. The relationship is shown in FIG. 2B as a negative linear slope 412 of the taper angle 406 of clamping layer 110B with respect to the phosphorous content 404 of clamping layer 110C. Typical values of the taper angle are also shown in FIG. 2B. For example, a 4% phosphorous content in clamping layer 110C will result in a taper angle of about 40° (with respect to membrane 112). A 5% phosphorous content in clamping layer 110C will result in a taper angle of about 35°, and a 6% content in clamping layer 110C will result in a taper angle of about 30°. A specific phosphorous percentage 408 will thus result in a corresponding taper angle 410 at point 414 along negative linear slope 412. While three examples relating phosphorous content to taper angle are shown in FIG. 2B, other examples can be envisioned including examples between the data points given, or outside the range shown in FIG. 2B.

Figure 2C:
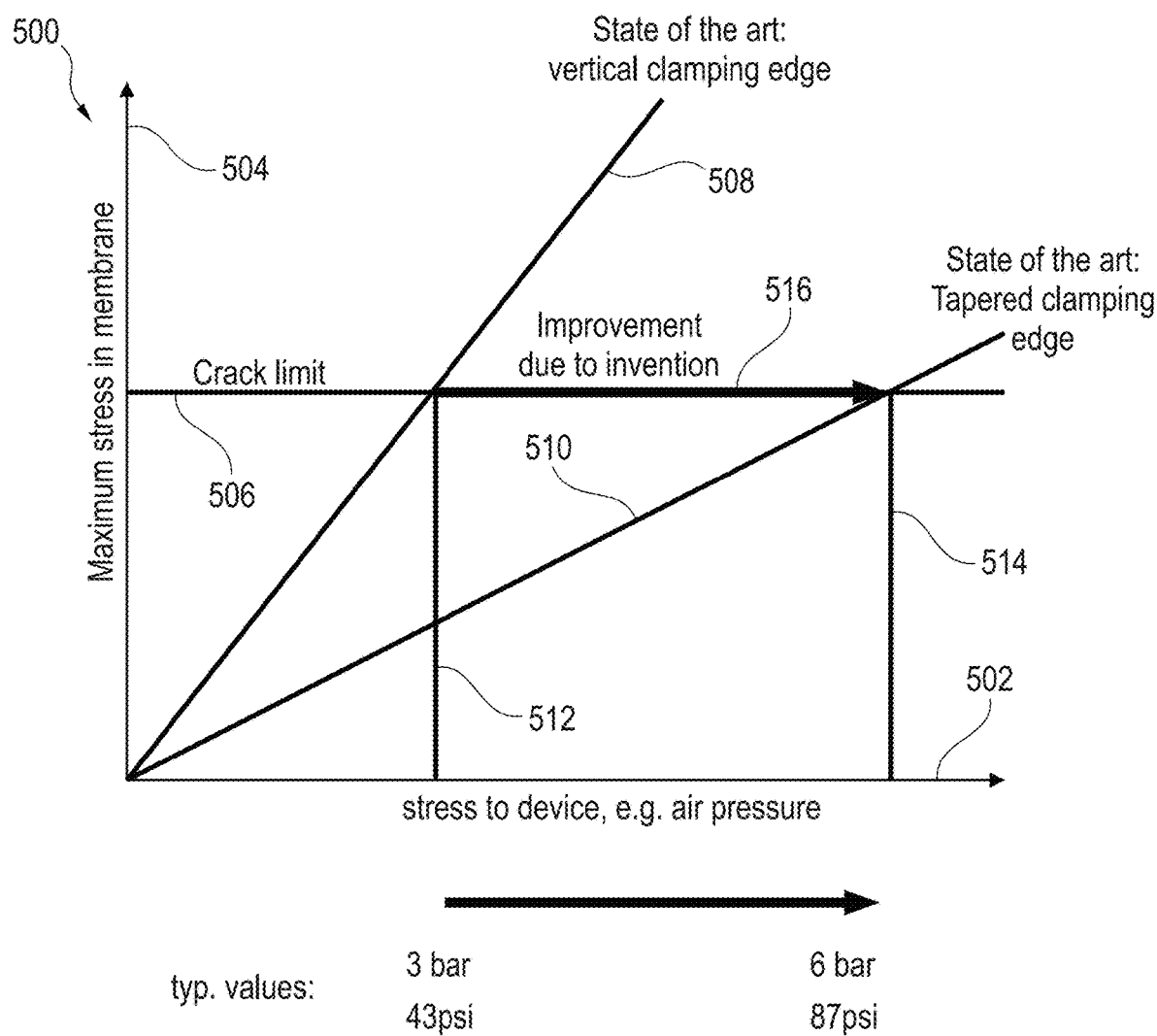
FIG. 2C is a graph showing the improvement in the tolerable stress level of a dual backplate MEMS microphone according to an embodiment with respect to the tolerable stress level of an exemplary dual backplate MEMS microphone.

FIG. 2C is a graph 500 showing the improvement in the tolerable stress level of a dual backplate MEMS microphone according to an embodiment with respect to the tolerable stress level of an exemplary dual backplate MEMS microphone. FIG. 2C illustrates the stress 504 in the membrane before versus the applied stress 502 (air pressure) to the MEMS device. A "crack limit" 506 is shown, which represents the maximum stress capable of being absorbed by the membrane before damage (cracking) occurs. In an embodiment the crack limit is about 5 gigapascals (GPa), although other embodiments will have different crack limits depending on, for example, the thickness and material of the membrane, among other factors. An exemplary dual backplate microphone will have a stress response 508 having a first positive slope that reaches the crack limit 506 at an applied stress level 512 of about 3 bar or about 43 psi. A dual backplate microphone embodiment including tapered clamping layers described in further detail below will have a stress response 514 having a second positive slope that reaches the crack limit 506 at an applied stress level 514 of about 6 bar or about 87 psi, resulting in a net improvement 516 of about 3 bar or about 44 psi. While the crack limit 516 is the same for both devices, the embodiment device is advantageously able to absorb a greater applied stress before reaching the crack limit 516.

Figure 3A:
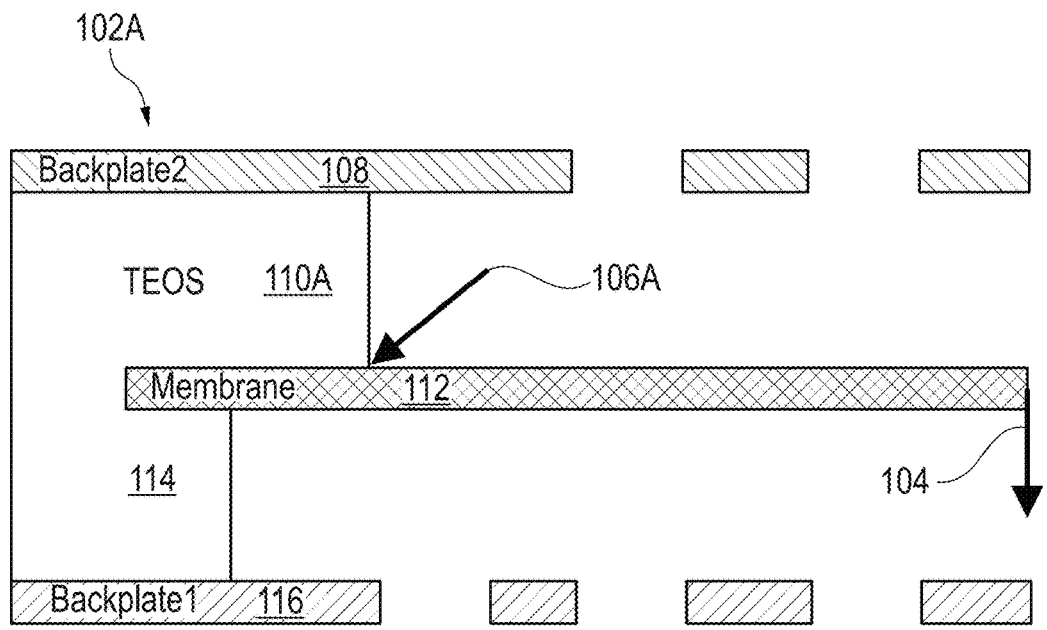
Figure 3B:
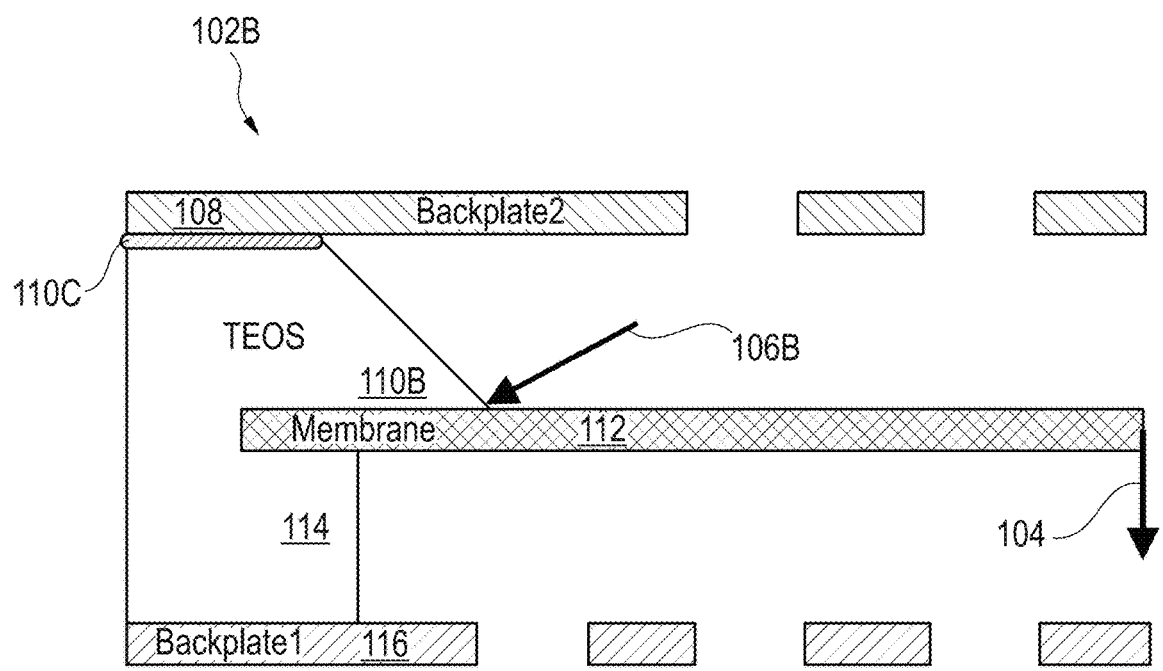
Figure 4A:
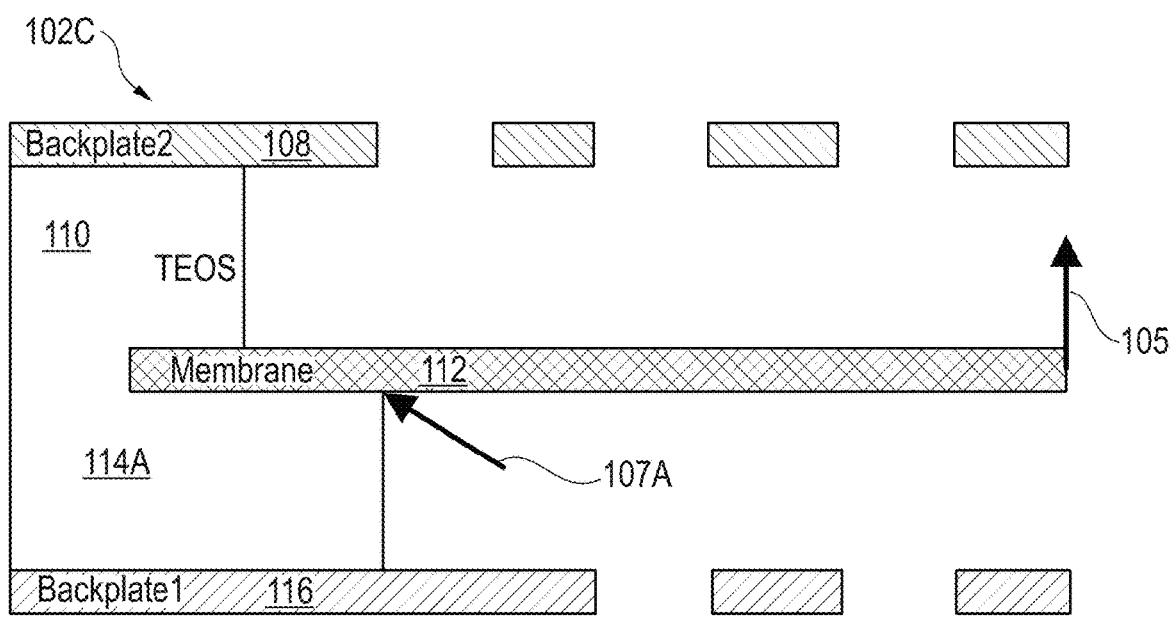
Figure 4B:
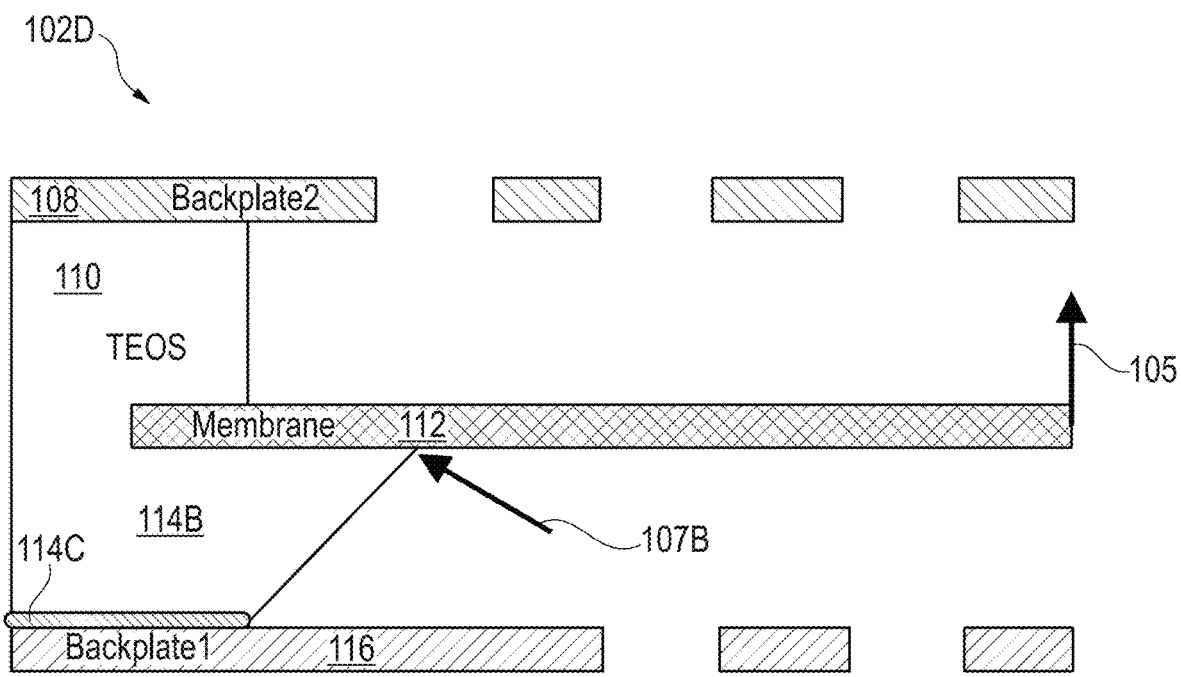
Figure 5A:
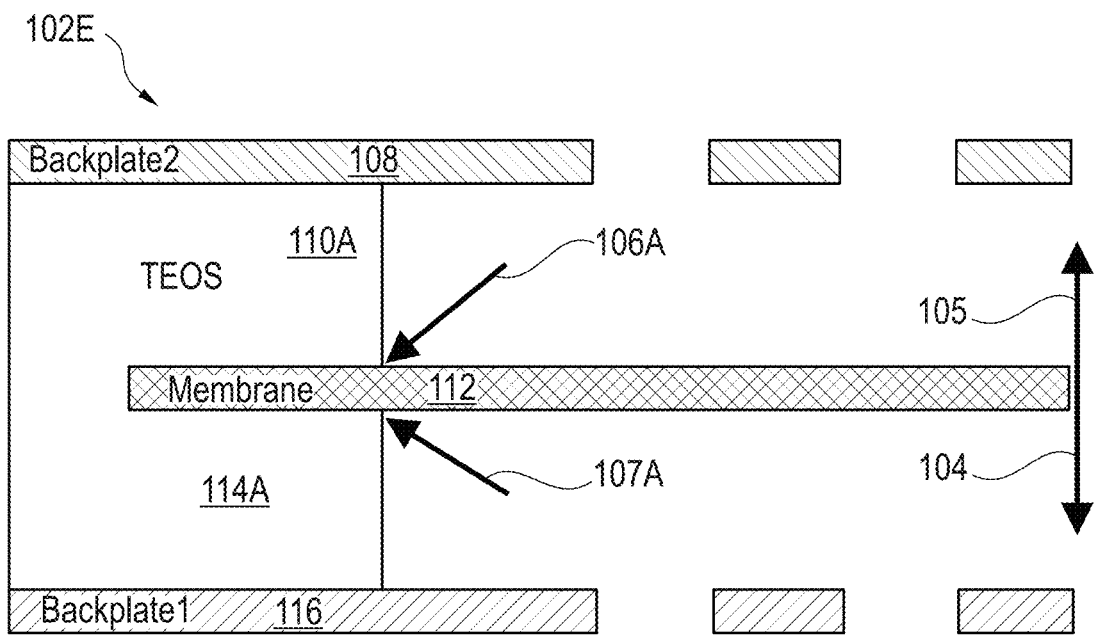

For ease of contrasting the various dual backplate microphone embodiments described herein, exemplary dual backplate microphones are illustrated in FIGS. 3A, 4A, and 5A, and described below. The dual backplate microphone embodiments are illustrated in FIGS. 3B, 4B, 5B, and 5C, and described below.

FIG. 3A illustrates an exemplary dual backplate microphone 102A previously described with respect to FIG. 1A including a first perforated backplate 116, a first clamping layer 114, a flexible membrane 112, a second clamping layer 110A, and a second perforated backplate 108. The vertical edge of the second clamping layer 110A extends over the vertical edge of the first clamping layer 114, which creates a hot spot or notch effect at 106A if the membrane 112 is deflected in the downward direction 104, as previously discussed.

FIG. 3B illustrates an embodiment dual backplate microphone 102B previously described with respect to FIG. 1B comprising a second clamping layer including a slow etch rate layer 110B and a fast etch layer 110C as previously discussed, wherein the negatively sloping edge of the second clamping layer (from the second backplate 108 to the membrane 112) advantageously decreases the hot spot or notch effect at 106B when the membrane 112 is deflected in the downward direction 104, as previously discussed.

FIG. 4A illustrates an exemplary dual backplate microphone 102C including a first perforated backplate 116, a first clamping layer 114A, a flexible membrane 112, a second clamping layer 110, and a second perforated backplate 108. The vertical edge of the first clamping layer 114A extends beyond the vertical edge of the second clamping layer 110, which creates a hot spot or notch effect at 107A if the membrane 112 is deflected in the upward direction 105.

FIG. 4B illustrates an embodiment dual backplate microphone 102D comprising a first clamping layer including a slow etch rate layer 114B and a fast etch layer 114C, wherein the negatively sloping edge of the first clamping layer (from the first backplate 116 to the membrane 112) advantageously decreases the hot spot or notch effect at 107B when the membrane 112 is deflected in the upward direction 105.

FIG. 5A illustrates an exemplary dual backplate microphone 102E including a first perforated backplate 116, a first clamping layer 114A, a flexible membrane 112, a second clamping layer 110A, and a second perforated backplate 108. The vertical edge of the first clamping layer 114A is coterminous with the vertical edge of the second clamping layer 110A, which creates hot spots or notch effects at 106A and 107A when the membrane 112 is deflected in the downward direction 104 and the upward direction 105, respectively.

Figure 5B:
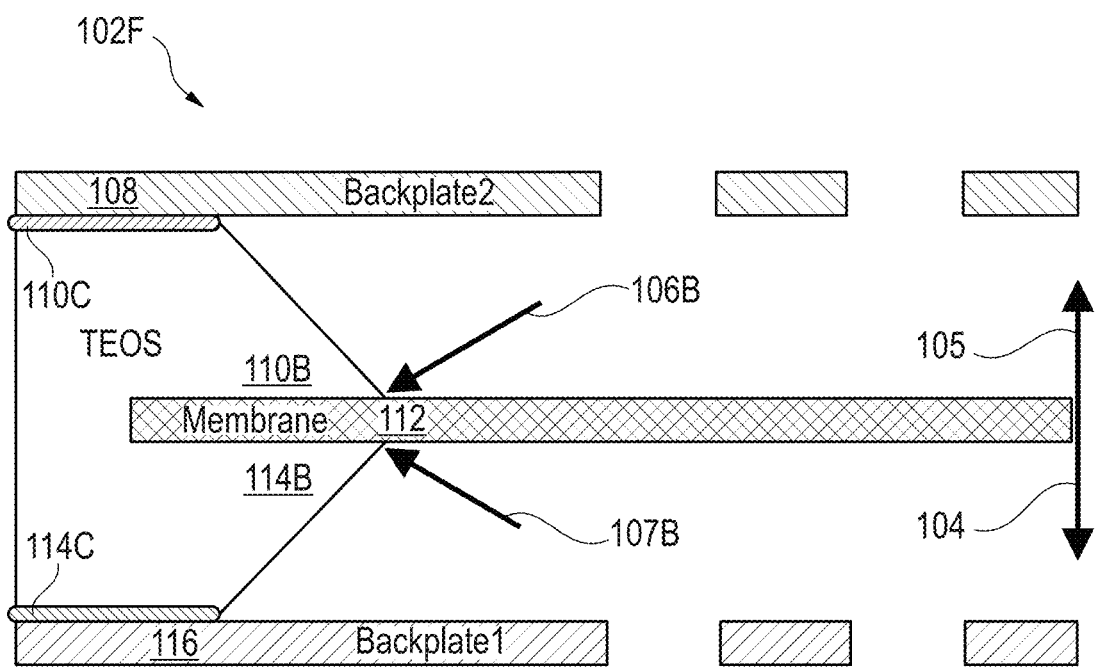

FIG. 5B illustrates an embodiment dual backplate microphone 102F including a first clamping layer including a slow etch rate layer 114B and a fast etch layer 114C, wherein the negatively sloping edge of the first clamping layer (from the first backplate 116 to the membrane 112) advantageously decreases the hot spot or notch effect at 107B when the membrane 112 is deflected in the upward direction 105. Dual backplate microphone 102F also includes a second clamping layer including a slow etch rate layer 110B and a fast etch layer 110C, wherein the negatively sloping edge of the second clamping layer (from the second backplate 108 to the membrane 112) advantageously decreases the hot spot or notch effect at 106B when the membrane 112 is deflected in the downward direction 104.

Figure 5C:
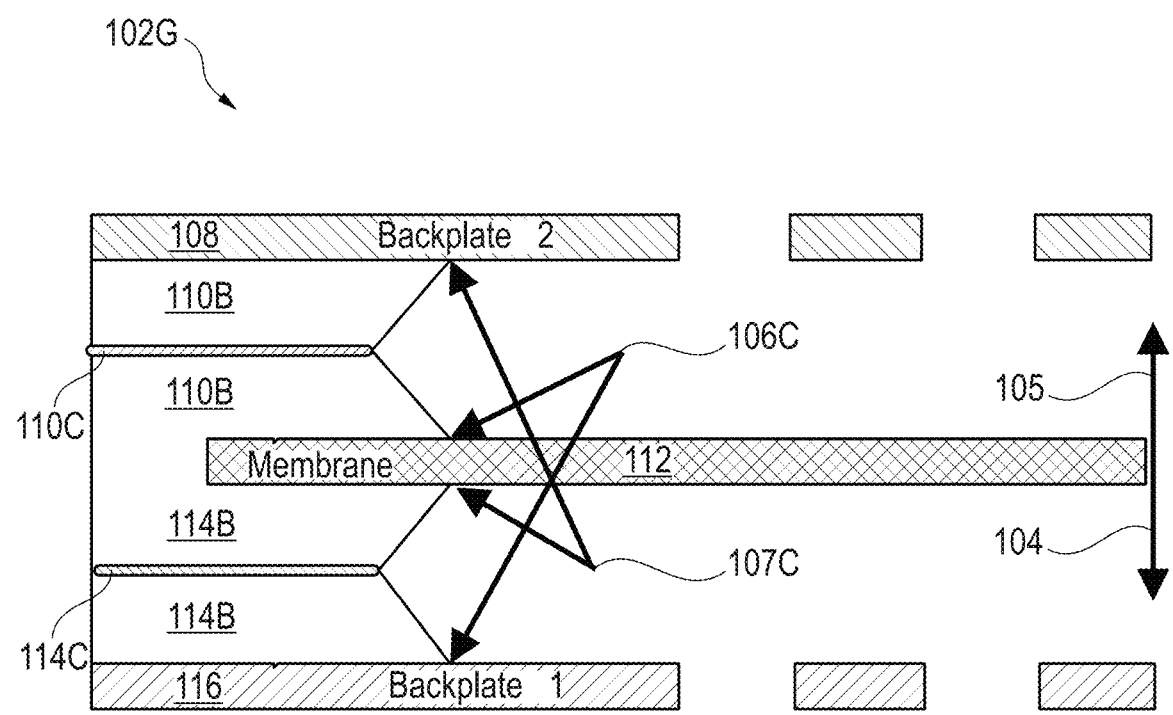

FIG. 5C illustrates an embodiment dual backplate microphone 102G including a first dual-slope clamping layer including two slow etch rate layers 114B and a fast etch layer 114C located between the two slow etch layers 114B. The negative and positive sloping edges of the first clamping layer advantageously decreases the hot spot or notch effect at both 106C and 107C when the membrane 112 is deflected in the downward direction 104 or the upward direction 105. Dual backplate microphone 102F also includes a second clamping layer including two slow etch rate layer 110B and a fast etch layer 110C located between the two slow etch layers 110B. The negative and positive sloping edges of the second clamping layer advantageously decreases the hot spot or notch effect at both 106C and 107C when the membrane 112 is deflected in the downward direction 104 or the upward direction 105. The position of the fast etch layers with respect to the adjacent slow etch layers can be adjusted in an embodiment.

FIGS. 6A, 6B, 6C, 6D, and 6E each comprise a layer table and process flow corresponding to an exemplary dual backplate MEMS microphone and embodiment dual backplate MEMS microphones including some or all of the following layers as is explained in further detail below: silicon or other substrate 602; a first isolation layer 604; a first backplate layer 606; isolation layer 2a 608; isolation layer 2b 610; isolation layer 2c 612; membrane layer 614; isolation layer 3a 616; isolation layer 3b 618; isolation layer 3c 620; second backplate layer 622; and metal contact layer 624. FIGS. 6A, 6B, 6C, 6D, and 6E also include two etching steps in the process flow: cavity etch 626 and release etch 628. The designation numerals are only set forth in FIG. 6E for clarity but pertain to FIGS. 6A through 6D and can be easily read across each of the table rows. Blank entries in the tables of FIGS. 6A through 6D indicate that the corresponding layer is not used.

FIG. 6A is a layer table and process flow corresponding to the exemplary dual backplate microphone 102A shown in FIG. 3A. FIG. 6A shows the sequence of layer deposition including a silicon substrate 602, a first TEOS isolation layer 604 formed on the silicon substrate 602, a first silicon backplate layer 606 formed on the first TEOS isolation layer 604, a second TEOS isolation layer 612 formed on the first silicon backplate layer 606, a silicon membrane layer 614 formed on the second TEOS isolation layer 612, a third TEOS isolation layer 616 formed on the silicon membrane layer 614, a second silicon backplate layer 622 formed on the third TEOS isolation layer 616, and metal contacts 624 formed on the second silicon backplate layer 622. A cavity etch 626 is performed to form a cavity under the first backplate 606 as is shown in FIG. 1A (first backplate is designated 116 in FIG. 1A). Finally an isotropic isolation release etch 628 is performed to form the vertical sidewalls of the first and second isolation (clamping) layers 110 and 114 also shown in FIG. 1A. Note that none of the fast etching PSG layers are used in the exemplary MEMS microphone of FIG. 3A and FIG. 6A.

FIG. 6B is a layer table and process flow corresponding to the dual backplate microphone embodiment 102B shown in FIG. 3B. FIG. 6B shows that the third isolation layer comprises a slow etching TEOS layer 3a 616 and a fast etching PSG layer 3b 618 to form the tapered edge of the isolation layer 110B shown in FIG. 3B.

FIG. 6C is a layer table and process flow corresponding to the dual backplate microphone embodiment 102D shown in FIG. 4B. FIG. 6C shows that the second isolation layer comprises a slow etching TEOS layer 2b 612 and a fast etching PSG layer 2a 608 to form the tapered edge of the isolation layer 114B shown in FIG. 4B.

FIG. 6D is a layer table and process flow corresponding to the dual backplate microphone embodiment 102F shown in FIG. 5B. FIG. 6D shows that the second isolation layer comprises a slow etching TEOS layer 2b 610 and a fast etching PSG layer 2a 608 to form the tapered edge of the isolation layer 114B shown in FIG. 5B. FIG. 6D also shows that the third isolation layer comprises a slow etching TEOS layer 3a 616 and a fast etching PSG layer 3b 618 to form the tapered edge of the isolation layer 110B shown in FIG. 5B.

FIG. 6E is a layer table and process flow corresponding to the dual backplate microphone embodiment 102G shown in FIG. 5C. FIG. 6E shows that the second isolation layer comprises two slow etching TEOS layers 2a 608 and 2c 612 and a fast etching PSG layer 2b 610 to form the tapered edges of the isolation layers 114B shown in FIG. 5C. FIG. 6E also shows that the third isolation layer comprises two slow etching TEOS layers 3a 616 and 3c 620 and a fast etching PSG layer 3b 618 to form the tapered edges of the isolation layers 110B shown in FIG. 5C.

Figure 7:
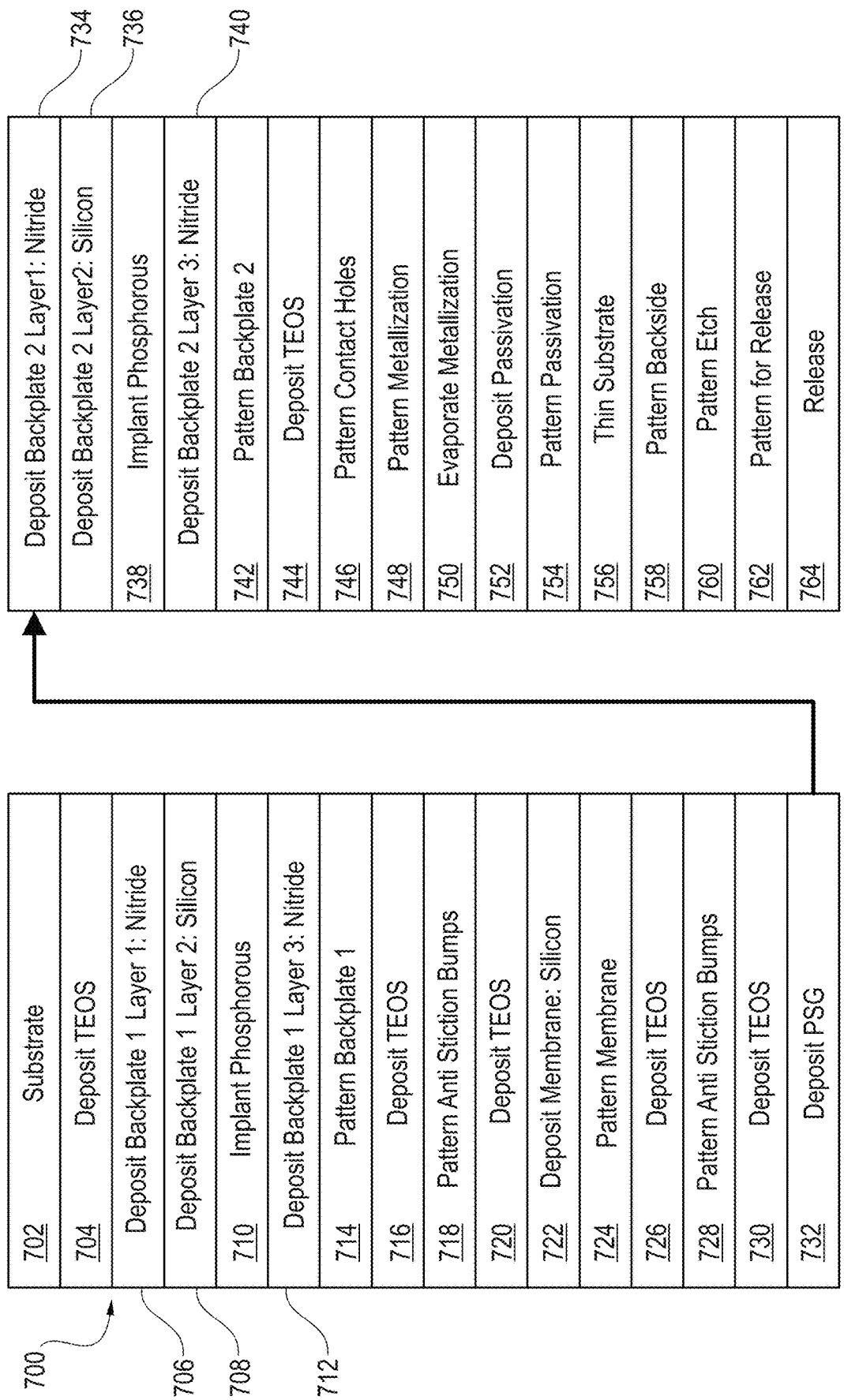
FIG. 7 is a table of a detailed process flow associated with the MEMS microphone of FIG. 3B.

FIG. 7 illustrates a block diagram of an embodiment detailed fabrication sequence 700 including steps 702-764. Fabrication steps 702-764 are applied to a partially formed dual backplate microphone workpiece, which becomes a fully formed dual backplate microphone at the conclusion of the fabrication sequence 700. According to various embodiments, fabrication sequence 700 is a fabrication sequence for producing various embodiment microfabricated devices, such as the microfabricated device 102B as shown in FIG. 3B, for example. Fabrication sequence 700 may also be applied and/or modified in order to produce various other embodiments described herein as well as equivalents.

In various embodiments, the detailed fabrication sequence 700 includes forming a silicon or plastic substrate 702 (not shown in FIG. 3B), forming a TEOS isolation layer 704 over the silicon substrate (also not shown in FIG. 3B), forming the first backplate 116, which comprises forming a nitride layer 706 over the TEOS isolation layer, forming a silicon layer 708 over the nitride layer, implanting phosphorous 710 in to the partially formed backplate 116, depositing another nitride layer 712 over the silicon layer, and patterning 714 backplate 116 to form perforations. The phosphorous implant may transform the silicon layer deposited at step 708 into an amorphous silicon layer, in an embodiment. The perforations in the first backplate 116 may include equal sized perforations or both large and small diameter perforations, in embodiments. Patterning the polysilicon layer in step 714, as well as patterning in other steps, may include depositing a photoresist layer, exposing the photoresist layer according to a mask pattern corresponding to the backplate structure, developing the photoresist to remove the non-pattern portions according to the exposure, etching the polysilicon layer, or other layers, according to the patterned photoresist, and removing the photoresist after completing the etch.

In various embodiments, the first clamping (isolation) layer 114 is formed by depositing a TEOS layer 716, patterning anti-stiction bumps 718 (not shown in FIG. 3B), and depositing another TEOS layer 720. Next, the membrane layer 112 is formed by depositing a silicon layer 722, patterning the membrane 724, depositing TEOS on the membrane 726, and patterning anti-stiction bumps 728 (not shown in FIG. 3B) on the membrane. Next, the second clamping (isolation) layer 110B is formed by depositing a TEOS layer 730 and a fast etching PSG layer 732 over the TEOS layer. Next, the second backplate 108 is formed by depositing a nitride layer 734, depositing a silicon layer 736 over the nitride layer, implanting phosphorous 738 in to the partially formed backplate 108, depositing another nitride layer 740 on the silicon layer, and patterning 742 backplate 108 to form perforations. The perforation in the second backplate 108 can also be of the same diameter or different diameters, in embodiments.

In various embodiments, another layer of TEOS is deposited 744, contact holes are patterned 746 for providing conductive contacts to electrically active layers, such as the membrane, backplate, and substrate, for example, and metallization layers are formed by patterning 748 and evaporating 750 the metallization. The metallization may be formed in contact holes and as metal traces from the contact holes to contact pads, for example. A passivation layer is deposited 752 and patterned 754 that may include, for example silicon nitride. The substrate is subsequently thinned 756, and the backside of the dual backplate microphone is patterned 758 and etched 760 to form a cavity below the first backplate 116, in an embodiment. Finally, the dual backplate microphone is patterned for release 762 and released (by isotropic etching) at 764 to release the membrane 112 from the first clamping layer 114 and the second clamping layer 110B and to form the tapered edge of the second clamping layer 110B.

The metallization described above with respect to steps 748 and 750 may include any conductive material, such as titanium, platinum, gold, or aluminum for example, and may have a thickness between 300 and 500 nm. In alternative embodiments, the metallization may include conductive alloys of the above described conductive materials or may include copper, for example. In various embodiments, steps 752 and 754 include depositing a passivation layer on the workpiece with a thickness between 300 and 500 nm. The passivation layer may be silicon nitride or another nonreactive insulator, for example. In some embodiments, the backside etch 760 is a plasma etch that may be performed according to the Bosch process.

According to various embodiments, the steps and materials deposited, formed, or patterned in steps 702-764 may be readily substituted for other steps and materials as is known in the art. For example, any oxide, nitride, or oxynitride may be substituted for other insulating materials and dielectrics in alternative embodiments. Further, the amorphous silicon and polysilicon materials may also be substituted with any other doped or undoped semiconductor materials, metals, or metal silicides, for example, in other embodiments. In addition, the patterning steps described herein may include photolithography or other non-lithographic methods in various embodiments. The growing, forming, or depositing of materials may be modified according to the specific materials to be used. In other embodiments, the layers may be formed with thicknesses outside the ranges specified directly below.

Typical dimensions and typical ranges for aspects of the various layers described above include an oxide thickness between the membrane and backplates (or stator described below) of about 1,800 nm with a range of about 1,000 nm to 3,000 nm; a PSG layer thickness of about 50 nm with a range of about 20 nm to 300 nm; PSG phosphorous content of about 5% with a range of about 2% to 15%; a membrane thickness of about 450 nm with a range of about 150 nm to 1,000 nm; a backplate/stator thickness of about 600 nm with a range of about 300 nm to 2,000 nm; and a backplate/stator stack (SiN/Si/SiN) of about 140/330/140 nm with a range of about 50-200/150-1,500/50-200 nm. The typical dimensions and typical ranges set forth above pertain to any of the microfabricated microphone embodiments of FIG. 3B, 4B, 5B, 5C, 9B, or 9C.

The detailed process flow for the dual backplate microphone embodiment 102D of FIG. 4B is not shown but is similar to that of FIG. 7, except for the order of the process steps. The detailed process flow for the dual backplate microphone embodiment 102F of FIG. 5B is not shown but is similar to that of FIG. 7, except that the processing steps and layers for the second clamping layer 110B/110C are repeated for the first clamping layer 114B/114C.

Figure 8:
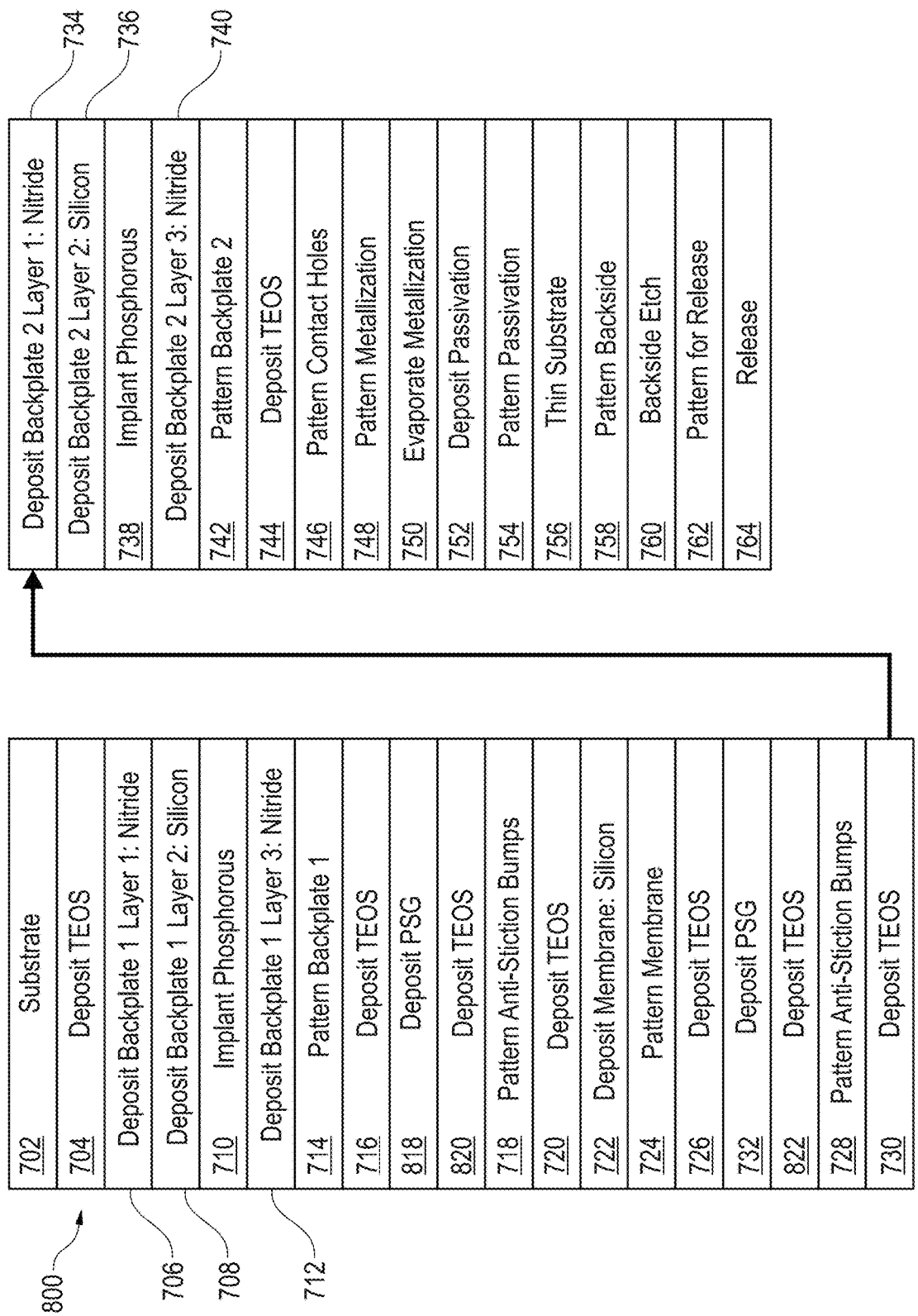
FIG. 8 is a table of a detailed process flow associated with the MEMS microphone of FIG. 5C.

FIG. 8 is a detailed process flow 800 corresponding to the dual backplate microphone embodiment shown in FIG. 5C, including previous processing steps 702 through 764 and including additional processing steps 818, 820, and 822 described in further detail below. The description for the detailed process flow is similar to that previously described with respect to the detailed process flow of FIG. 7, except that each clamping layer 110B/110C/110B and 114B/114C/114B in the dual backplate microphone of FIG. 5C includes two slow etch TEOS layers, and a single fast etch PSG layer. Fabrication of the first clamping layer comprises process flow steps 716 (deposit a slow etch TEOS layer), 818 (deposit a fast etch PSG layer), and 820 (deposit another slow etch TEOS layer), and fabrication of the second clamping layer comprises process flow steps 726 (deposit a slow etch TEOS layer), 732 (deposit a fast etch PSG layer), and 822 (deposit another slow etch TEOS layer).

Figure 9A:
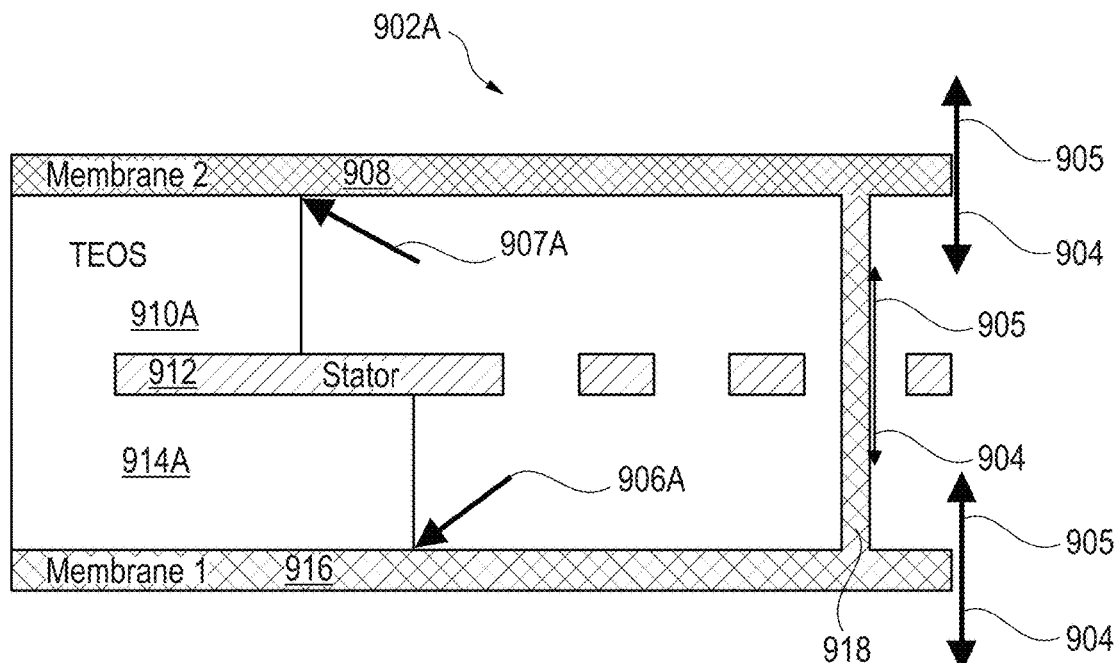
FIG. 9A is a cross-sectional diagram of an exemplary sealed dual membrane MEMS microphone.

For ease of contrasting the various sealed dual membrane microphone embodiments described herein, an exemplary sealed dual membrane microphone 902A is illustrated in FIG. 9A and described below. The dual backplate microphone embodiments 902B and 902C are illustrated in FIGS. 9B and 9C, respectively, and described below.

FIG. 9A illustrates an exemplary sealed dual membrane microphone 902A including a first membrane 916, a first isolation layer 914A, a perforated stator 912, a second isolation layer 910A, a second membrane 908, and a pillar 918 coupling the first membrane 916 to the second membrane 908. In an embodiment, pillar 918 can comprise a nitride and/or oxide pillar, although other suitable materials can be used. The vertical edge of the first clamping layer 914A extends beyond the vertical edge of the second clamping layer 910A, which creates a hot spot or notch effect at 906A if the membranes 908 and 916 are deflected in the downward direction 904, and which also creates a hot spot or notch effect at 907A if the membranes 908 and 916 are deflected in the upward direction 905.

Figure 9B:
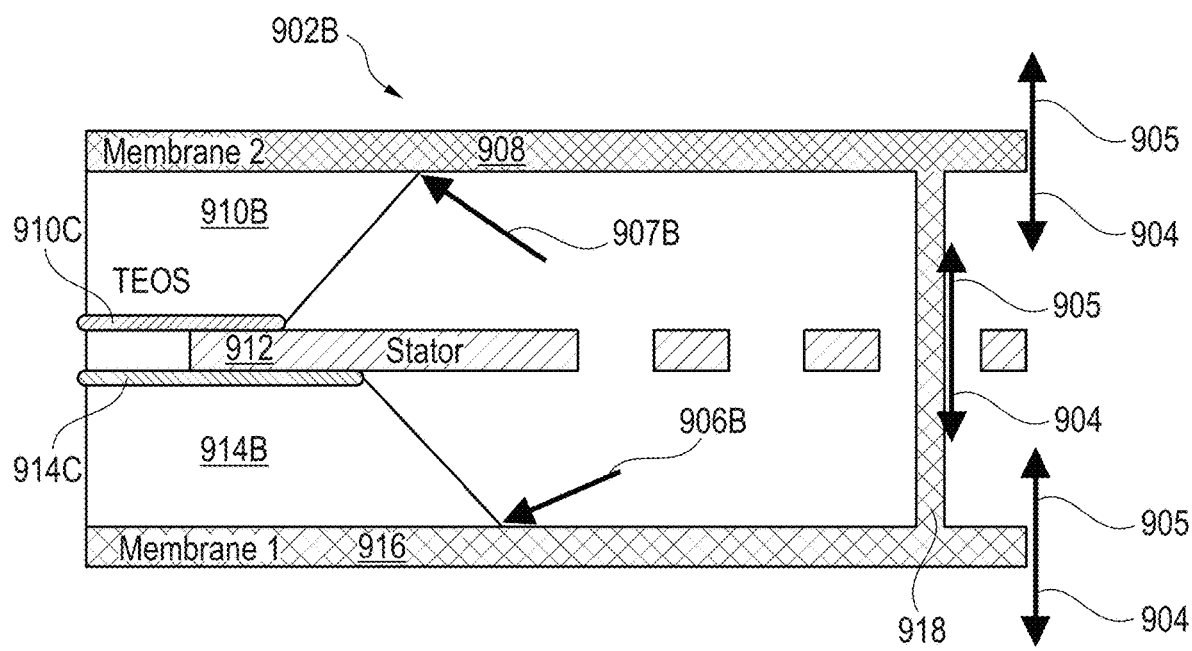
FIGS. 9B and 9C are cross-sectional diagrams of sealed dual membrane MEMS microphones, according to an embodiment.

FIG. 9B illustrates an embodiment sealed dual membrane microphone 902B including a first isolation layer including a slow etch rate layer 914B and a fast etch layer 914C, wherein the negatively sloping edge of the first clamping layer (from the stator 912 to the first membrane 916) advantageously decreases the hot spot or notch effect at 906B when the membranes 908 and 916 are deflected in the downward direction 904. Sealed dual membrane microphone 902B also includes a second isolation layer including a slow etch rate layer 910B and a fast etch layer 910C, wherein the negatively sloping edge of the second clamping layer (from the stator 912 to the second membrane 908) advantageously decreases the hot spot or notch effect at 907B when the membranes 908 and 916 are deflected in the upward direction 905.

Figure 9C:
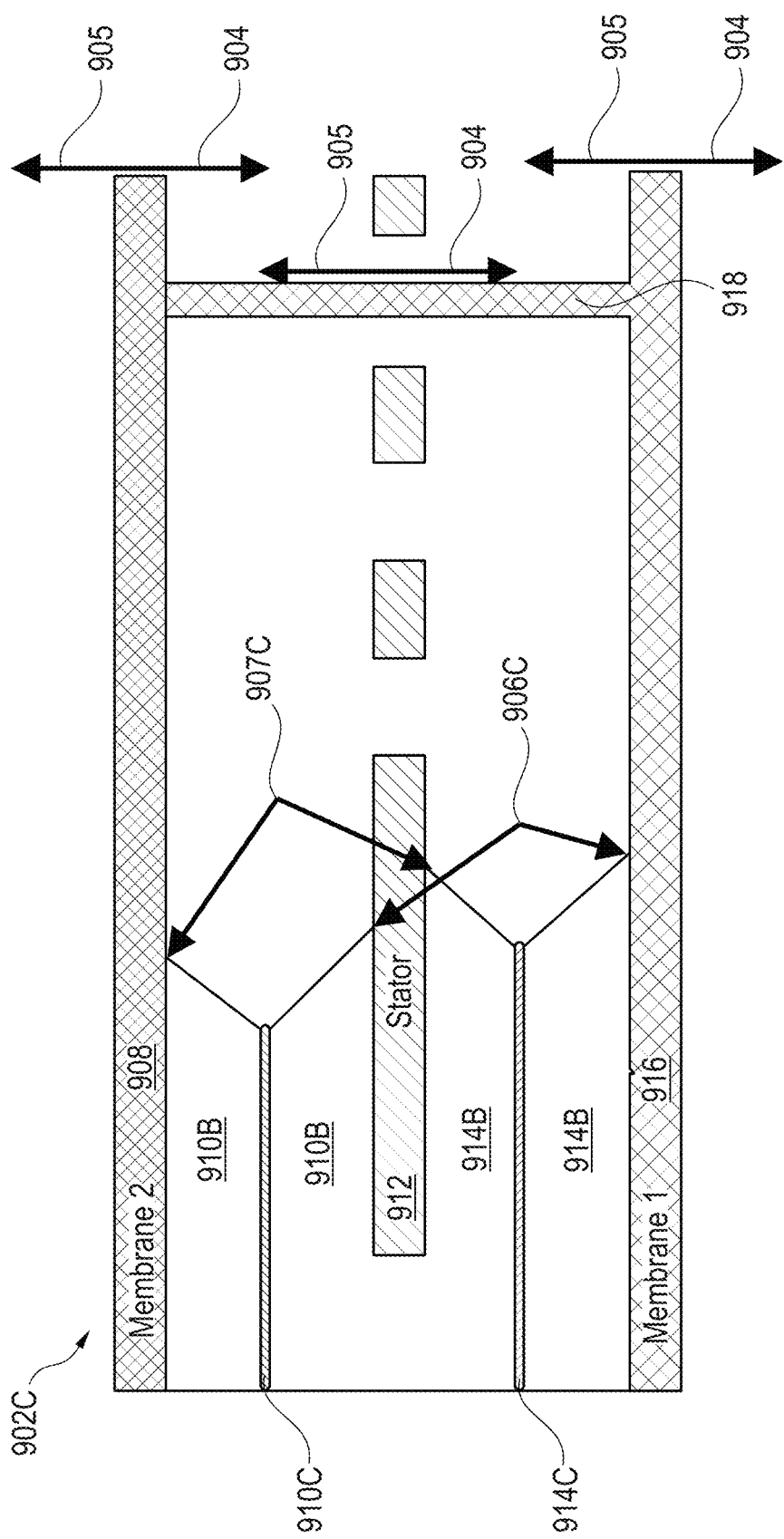

FIG. 9C illustrates an embodiment sealed dual membrane microphone 902C including a first dual-slope clamping layer including two slow etch rate layers 914B and a fast etch layer 914C located between the two slow etch layers 914B. The negative and positive sloping edges of the first clamping layer advantageously decreases the hot spot or notch effect at both 906C and 907C when the membranes 908 and 916 are deflected in the downward direction 904 or the upward direction 905. Sealed dual membrane microphone 902C also includes a second clamping layer including two slow etch rate layers 910B and a fast etch layer 910C located between the two slow etch layers 910B. The negative and positive sloping edges of the second clamping layer advantageously decreases the hot spot or notch effect at both 906C and 907C when the membranes 908 and 916 are deflected in the downward direction 904 or the upward direction 905. The position of the fast etch layers with respect to the adjacent slow etch layers can be adjusted in an embodiment.

While FIGS. 9B and 9C show tapered or dual-tapered isolation layers on both sides of the stator, it will be apparent to those skilled in the art that tapered or dual-tapered isolation layers can be fabricated on only one side of the stator, similar to the dual backplate microphone embodiments previously described and shown in FIGS. 3B and 4B.

Figure 10B:
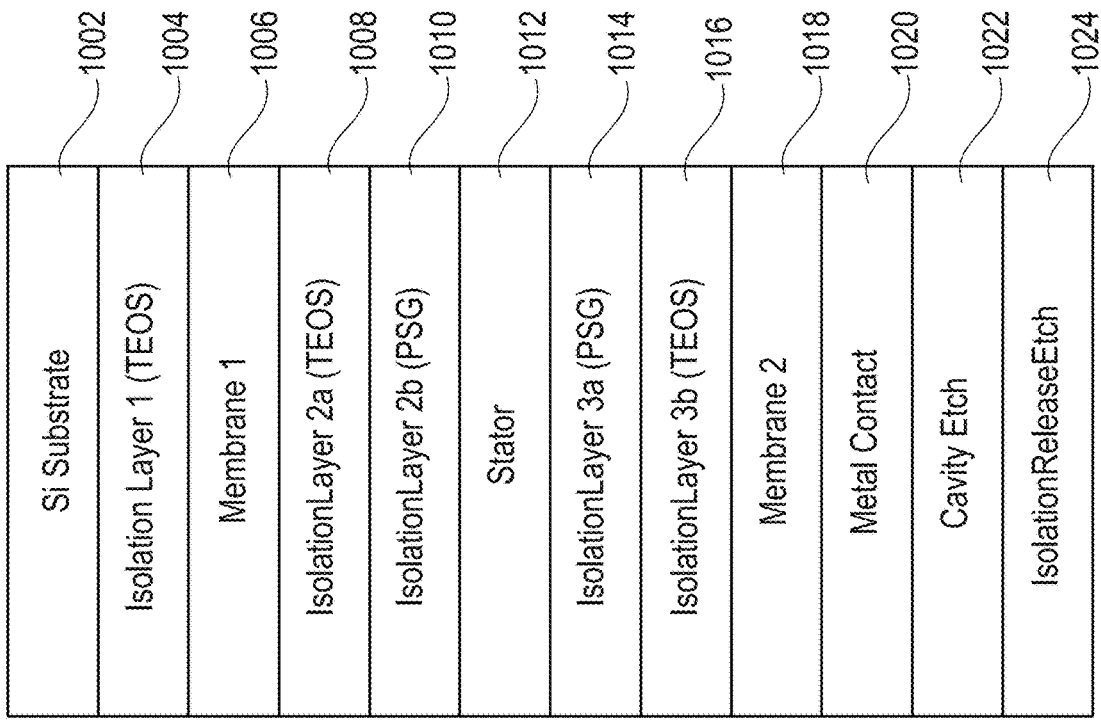
FIG. 10B is a layer table associated with the MEMS microphone of FIG. 9B.
Figure 10A:
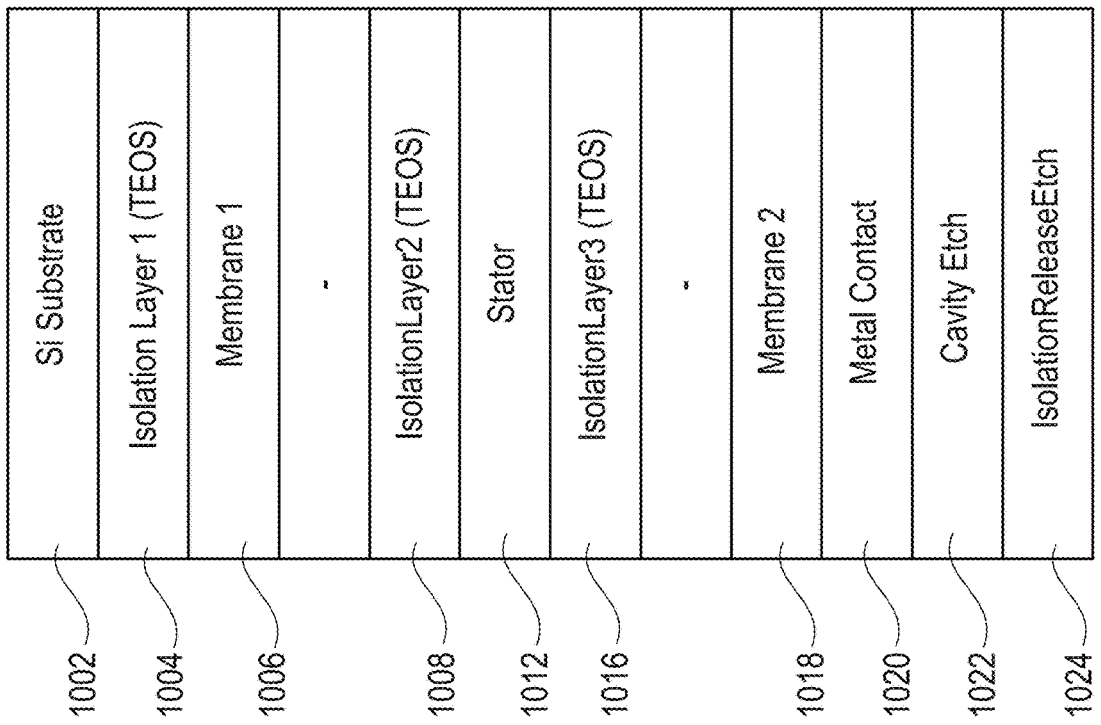
FIG. 10A is a layer table associated with the MEMS microphone of FIG. 9A.

FIG. 10A is a layer table and process flow corresponds to the exemplary sealed dual membrane microphone 902A shown in FIG. 9A. FIG. 10A shows the sequence of layer deposition including a silicon substrate 1002, a first TEOS isolation layer 1004 formed on the silicon substrate 1002, a first silicon membrane layer 1006 formed on the first TEOS isolation layer 1004, a second TEOS isolation layer 1008 formed on the first silicon membrane layer 1006, a silicon stator 1012 formed on the second TEOS isolation layer 1008, a third TEOS isolation layer 1016 formed on the silicon stator 1012, a second silicon membrane layer 1018 formed on the third TEOS isolation layer 1016, and metal contacts 1020 formed on the second silicon membrane layer 1018. A cavity etch 1022 is performed to form a cavity under the first membrane 1006. Finally an isotropic isolation release etch 1024 is performed to form the vertical sidewalls of the first and second isolation layers 910A and 914A shown in FIG. 9A.

FIG. 10B is a layer table and process flow corresponding to the sealed dual membrane microphone embodiment 902B shown in FIG. 9B. FIG. 10B shows that the second isolation layer comprises a slow etching TEOS layer 2a 1008 and a fast etching PSG layer 2b 1010 to form the tapered edge of the isolation layer 914B shown in FIG. 9B. FIG. 10B also shows that the third isolation layer comprises a slow etching TEOS layer 3a 1014 and a fast etching PSG layer 3b 1016 to form the tapered edge of the isolation layer 910B shown in FIG. 9B.

A layer table is not shown for embodiment microphone 902 shown in FIG. 9C, but would be similar to the layer table of FIG. 10B, including two slow etch TEOS layers 914B and a single fast etch PSG layer 914C for the first isolation layer, and including two slow etch TEOS layers 910B and a single fast etch layer 910C for the second isolation layer.

The layer thickness for the sealed dual membrane microphone 902B and 902C shown in FIGS. 9B and 9C were previously described. The perforations shown in stator 912 can be of the same diameter, or can include two or more different sized perforations such as a plurality of large sized perforations and a plurality of small sized perforations. The pillar 918 can comprise a nitride and/or oxide pillar as previously described, although other suitable materials can be used.

It is an advantage that the dual backplate microphone embodiments and sealed dual membrane microphone embodiments exhibit increased robustness for deflections in both directions (from the top and from the bottom), with a minimum of increased fabrication complexity and cost. In embodiments, only two to four additional processing steps are required to achieve the increased robustness.

Example embodiments of the present invention are summarized here. Other embodiments can also be understood from the entirety of the specification and the claims filed herein.

Example 1. According to an embodiment, a microfabricated structure comprises a deflectable membrane; a first clamping layer disposed on a first surface of the deflectable membrane; a second clamping layer disposed on a second surface of the deflectable membrane; a first perforated backplate disposed on the first clamping layer; and a second perforated backplate disposed on the second clamping layer, wherein the first clamping layer comprises a first tapered edge portion having a negative slope between the first perforated backplate and the deflectable membrane.

Example 2. The microfabricated structure of Example 1, wherein the first clamping layer comprises a second tapered edge portion having a positive slope between the first perforated backplate and the deflectable membrane.

Example 3. The microfabricated structure of any of the previous examples, wherein the second clamping layer comprises a first tapered edge portion having a negative slope between the second perforated backplate and the deflectable membrane.

Example 4. The microfabricated structure of any of the previous examples, wherein the second clamping layer comprises a second tapered edge portion having a positive slope between the second perforated backplate and the deflectable membrane.

Example 5. The microfabricated structure of any of the previous examples, wherein the first clamping layer comprises a first glass layer having a low etch rate, and a second glass layer having a high etch rate.

Example 6. The microfabricated structure of any of the previous examples, wherein the second glass layer is disposed between the first glass layer and the first perforated backplate.

Example 7. The microfabricated structure of any of the previous examples, wherein the second glass layer is disposed in the first glass layer.

Example 8. The microfabricated structure of any of the previous examples, wherein the second glass layer comprises between about 4% and 6% phosphorous.

Example 9. According to an embodiment, a microfabricated structure comprises a perforated stator; a first isolation layer disposed on a first surface of the perforated stator; a second isolation layer disposed on a second surface of the perforated stator; a first membrane disposed on the first isolation layer; a second membrane disposed on the second isolation layer; and a pillar coupled between the first membrane and the second membrane, wherein the first isolation layer comprises a first tapered edge portion having a negative slope between the perforated stator and the first membrane.

Example 10. The microfabricated structure of Example 9, wherein the first isolation layer comprises a second tapered edge portion having a positive slope between the perforated stator and the first membrane.

Example 11. The microfabricated structure of any of the previous examples, wherein the second isolation layer comprises a first tapered edge portion having a negative slope between the perforated stator and the second membrane.

Example 12. The microfabricated structure of any of the previous examples, wherein the second isolation layer comprises a second tapered edge portion having a positive slope between the perforated stator and the second membrane.

Example 13. The microfabricated structure of any of the previous examples, wherein the first isolation layer comprises a first glass layer having a low etch rate, and a second glass layer having a high etch rate.

Example 14. The microfabricated structure of any of the previous examples, wherein the second glass layer is disposed between the first glass layer and the perforated stator.

Example 15. The microfabricated structure of any of the previous examples, wherein the second glass layer is disposed in the first glass layer.

Example 16. The microfabricated structure of any of the previous examples, wherein the second glass layer comprises between about 4% and 6% phosphorous.

Example 17. According to an embodiment, a method comprises forming a membrane; forming a first clamping layer on a first surface of the membrane; forming a second clamping layer on a second surface of the membrane; forming a first backplate on the first clamping layer; forming a second backplate disposed on the second clamping layer; and etching the first clamping layer to form a first tapered edge portion having a negative slope between the first backplate and the membrane.

Example 18. The method of Example 17, further comprising etching the first clamping layer to form a second tapered edge portion having a positive slope between the first backplate and the membrane.

Example 19. The method of any of the previous examples, further comprising etching the second clamping layer to form a first tapered edge portion having a negative slope between the second backplate and the membrane.

Example 20. The method of any of the previous examples, further comprising etching the second clamping layer to form a second tapered edge portion having a positive slope between the second backplate and the membrane.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A microfabricated structure comprising:
  a deflectable membrane;
  a first clamping layer disposed on a first surface of the deflectable membrane;
  a second clamping layer disposed on a second surface of the deflectable membrane;
  a first perforated backplate disposed on the first clamping layer; and a second perforated backplate disposed on the second clamping layer, wherein the first clamping layer comprises a first tapered edge portion creating, within the first clamping layer, an acute angle with the first perforated backplate, and wherein the first clamping layer comprises a first glass layer having a low etch rate, and a second glass layer having a high etch rate.

2. The microfabricated structure of claim 1, wherein the first clamping layer comprises a second tapered edge portion creating, within the first clamping layer, an acute angle with the deflectable membrane.

3. The microfabricated structure of claim 1, wherein the second clamping layer comprises a first tapered edge portion creating, within the second clamping layer, an acute angle with the second perforated backplate.

4. The microfabricated structure of claim 3, wherein the second clamping layer comprises a second tapered edge portion creating, within the second clamping layer, an acute angle with the deflectable membrane.

5. The microfabricated structure of claim 1, wherein the second glass layer is disposed between a portion of the first glass layer and the first perforated backplate.

6. The microfabricated structure of claim 1, wherein the second glass layer is disposed in the first glass layer.

7. The microfabricated structure of claim 1, wherein the second glass layer comprises between about 4% and 6% phosphorous.

8. A method of providing a microfabricated structure, the method comprising:
providing a deflectable membrane;
disposing a first clamping layer on a first surface of the deflectable membrane;
disposing a second clamping layer on a second surface of the deflectable membrane;
disposing a first perforated backplate on the first clamping layer; and
disposing a second perforated backplate on the second clamping layer,
wherein the first clamping layer comprises a first tapered edge portion creating, within the first clamping layer, an acute angle with the first perforated backplate, and wherein the first clamping layer comprises a first glass layer having a low etch rate, and a second glass layer having a high etch rate.

9. The method of claim 8, wherein the first clamping layer comprises a second tapered edge portion creating, within the first clamping layer, an acute angle with the deflectable membrane.

10. The method of claim 8, wherein the second clamping layer comprises a first tapered edge portion creating, within the second clamping layer, an acute angle with the second perforated backplate.

11. The method of claim 10, wherein the second clamping layer comprises a second tapered edge portion creating, within the second clamping layer, an acute angle with the deflectable membrane.

12. The method of claim 8, wherein the second glass layer is disposed between a portion of the first glass layer and the first perforated backplate.

13. The method of claim 8, wherein the second glass layer is disposed in the first glass layer.

14. The method of claim 8, wherein the second glass layer comprises between about 4% and 6% phosphorous.

15. A microfabricated structure comprising:
a deflectable membrane;
a first clamping layer disposed on a first surface of the deflectable membrane;
a second clamping layer disposed on a second surface of the deflectable membrane;
a first perforated backplate disposed on the first clamping layer; and
a second perforated backplate disposed on the second clamping layer,
wherein the first clamping layer comprises a first linearly tapered edge portion creating, within the first clamping layer, an acute angle with the first perforated backplate, and wherein the first clamping layer comprises a first glass layer having a low etch rate, and a second glass layer having a high etch rate.

16. The microfabricated structure of claim 15, wherein the first clamping layer comprises a second linearly tapered edge portion creating, within the first clamping layer, an acute angle with the deflectable membrane.

17. The microfabricated structure of claim 15, wherein the second clamping layer comprises a first linearly tapered edge portion creating, within the second clamping layer, an acute angle with the second perforated backplate.

18. The microfabricated structure of claim 17, wherein the second clamping layer comprises a second linearly tapered edge portion creating, within the second clamping layer, an acute angle with the deflectable membrane.

19. The microfabricated structure of claim 15, wherein the second glass layer is disposed between a portion of the first glass layer and the first perforated backplate.

20. The microfabricated structure of claim 15, wherein the second glass layer is disposed in the first glass layer.

21. The microfabricated structure of claim 15, wherein the second glass layer comprises between about 4% and 6% phosphorous.

* * * * *